United States Patent [19]

Gollehon

[11] 4,314,620

[45] Feb. 9, 1982

[54] LOUDSPEAKER WITH CONE DRIVEN HORN

[75] Inventor: John T. Gollehon, Grand Rapids, Mich.

[73] Assignee: Gollehon Industries, Inc., Grand Rapids, Mich.

[21] Appl. No.: 155,212

[22] Filed: Jun. 2, 1980

[51] Int. Cl.$^3$ .............................................. H05K 5/00

[52] U.S. Cl. .................................... 181/144; 181/152; 181/156

[58] Field of Search ................................ 181/144-148, 181/152, 156, 159, 163, 177, 184, 192

[56] References Cited

U.S. PATENT DOCUMENTS

| | | | |
|---|---|---|---|
| 2,815,087 | 12/1957 | Delort | 181/152 |
| 3,065,816 | 11/1962 | Ranger | 181/147 |
| 3,356,179 | 12/1967 | Tompkins | 181/152 |
| 4,112,256 | 9/1978 | Carlsson | 181/154 X |

OTHER PUBLICATIONS

"TFL Bass Bin", Heil Sound, Marissa, Illinois.

"Leviathan Fiberglass Bass Horn", Community Light and Sound, Philadelphia, Pa.

"S2 Sound Reinforcement Loudspeaker," Gollehon, Grand Rapids, Mich.

"Bose Model 802", Bose.

"New Products for Entertainment for Altec Lansing and Stanal Sound," Altec Lansing International, Anaheim, Calif.

"Full Range Horn Loaded System," Community Light and Sound, Philadelphia, Pa.

"Have You Considered the Potential of Molded Fiberglass?, " Community Light and Sound, Philadelphia, Pa..

*Primary Examiner*—L. T. Hix

*Assistant Examiner*—Thomas H. Tarcza

*Attorney, Agent, or Firm*—Price, Heneveld, Huizenga & Cooper

[57] ABSTRACT

A loudspeaker comprises a horn having an open throat from which a pair of outwardly curved side walls extend. A cone driven speaker is mounted in the horn throat, and the horn with attached speaker is mounted in a base reflex enclosure which forms a chamber therebetween. A compression driven tweeter is mounted in one of the curved horn side walls, and a port is disposed through the other horn side wall and communicates with the chamber to vent back waves.

16 Claims, 7 Drawing Figures

LOUDSPEAKER WITH CONE DRIVEN HORN

CROSS-REFERENCES TO RELATED APPLICATIONS

The present application relates to my copending, design patent application, Ser. No. 155,226, entitled LOUDSPEAKER, filed June 2, 1980.

BACKGROUND OF THE INVENTION

The present invention relates to loudspeakers, and in particular to a cone driven horn speaker.

Horn loaded loudspeakers are typically driven by a compression driver, as opposed to a cone or diaphragm driver, and are normally used as high frequency tweeters. Although there are some commercial loudspeakers which employ a cone driven horn, they are usually designed for public address systems, and are not capable of generating a full audio range for musical productions. Those commercial loudspeakers which are capable of producing a full range of audio sound for both public address and music are known in the trade as "sound reinforcement loudspeakers".

Some horn driven loudspeakers, such as those disclosed in the publication "TFL Bass Bin" by Heil Sound, have been combined with other types of loudspeakers in an attempt to achieve an assemblage of speakers capable of generating a full range of audio sounds, including the reproduction of music. However, such speaker assemblies comprise a number of separate component parts, and are very bulky and heavy, such that they are not particularly suited for many applications, particularly those uses which require frequent transportation of the audio equipment, such as concert tours, and the like. Because these speaker arrangements are component assemblies, they also require additional time for assembly and disassembly. Further, the horn loaded portion of the assembly is not a true radial horn configuration, thereby sacrificing speaker efficiency and sound distribution. The large size and untidy component appearance of these speakers represent substantial disadvantages even when the same are used in relatively stationary applications, such as in night clubs and discotheques.

SUMMARY OF THE INVENTION

One aspect of the present invention is to provide a full range loudspeaker, comprising a radial horn having an open throat and a pair of outwardly curved side walls extending therefrom. A cone driven speaker is mounted in the open throat of the horn, and produces an audio response to an input signal. A bass reflex enclosure has an open side in which the horn with attached speaker is mounted, and forms a chamber between the horn and the enclosure. A compression driven tweeter is mounted in one of the curved horn side walls, and produces a separate audio response to another input signal. A port is disposed in the other of the curved horn side walls, and communicates with the chamber to vent back waves therein.

A broader aspect of the present invention is to provide a loudspeaker, comprising a horn having an open throat and outwardly flared side walls extending therefrom. A cone driven speaker is mounted in the open throat of the horn, and the horn with attached speaker is mounted in a bass reflex enclosure, and forms a chamber therebetween. A port is disposed in one of the outwardly flared horn side walls, and a duct communicates the port with the chamber to vent back waves therein, thereby forming a compact, integral loudspeaker arrangement having a neat, streamlined appearance.

The principal objects of the present invention are to provide a compact, cone driven horn speaker. The speaker is preferably full range, and includes a horn tweeter mounted in one side wall of the horn, and a duct mounted in the other side wall of the horn. The cone driven speaker produces mid-range sounds, the horn tweeter produces high frequency sounds, and low frequency bass waves are emitted from the duct. The duct and tweeter are positioned in a manner to alleviate standing waves or reflections, and to produce a highly efficient loudspeaker with a good dispersion pattern. The loudspeaker is of an integral design, having a neat, tidy, and attractive appearance.

These and other features, advantages and objects of the present invention will be further understood and appreciated by those skilled in the art by reference to the following written specification, claims and appended drawings.

DETAILED DESCRIPTION OF THE PREFERRED EMBODIMENTS

Figure 1:
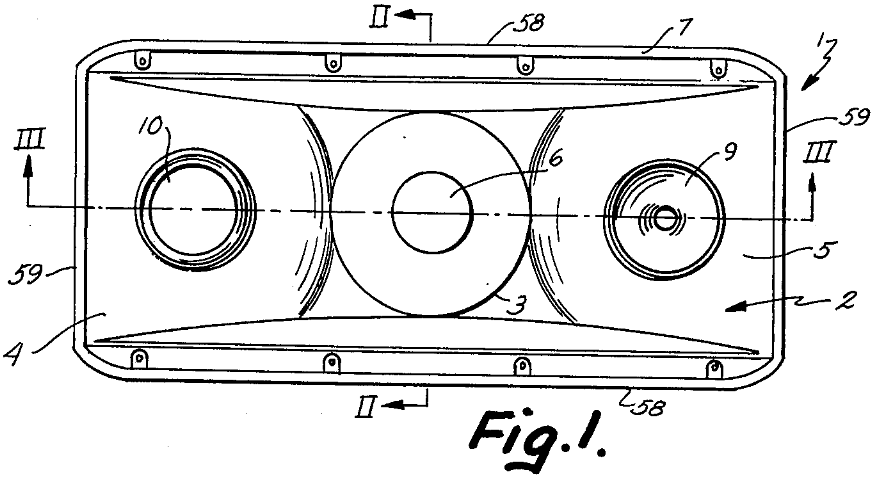
FIG. 1 is a front elevational view of a loudspeaker, embodying the present invention.

For purposes of description herein, the terms "upper", "lower", "right", "left", "rear", "front", "vertical," "horizontal," and derivatives thereof shall relate to the invention as oriented in FIG. 1. However, it is to be understood that the invention may assume various alternative orientations, except where expressly specified to the contrary.

The reference numeral 1 (FIG. 1) generally designates a loudspeaker embodying the present invention, comprising a horn 2 having an open throat 3 from which a pair of outwardly flared side walls 4 and 5 extend. A cone driven speaker 6 is mounted in the horn throat 3, and the speaker and horn assembly are encased in a base reflex enclosure 7 which forms a chamber 8 (FIG. 3) therebetween. A compression driven speaker 9 is mounted in one of the horn side walls 4 and 5, and a ducted port 10 is disposed in the other horn side wall, and communicates with chamber 8 to vent back waves.

Figure 5:
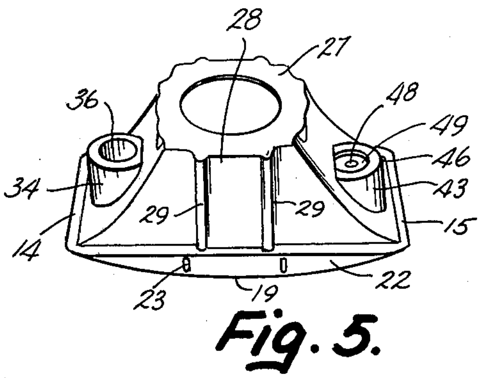
FIG. 5 is a perspective view of a horn portion of the loudspeaker taken from a rear elevation.
Figure 6:
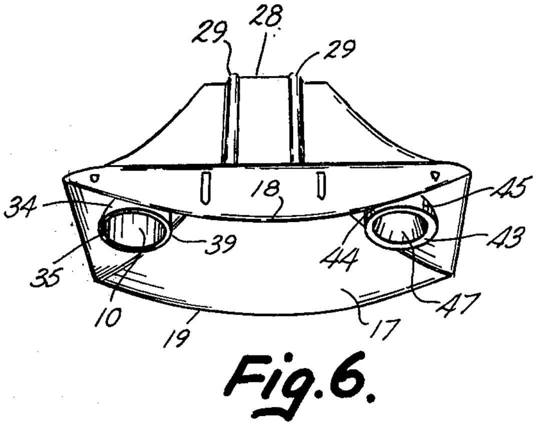
FIG. 6 is a perspective view of the horn, taken from an upwardly elevation.
Figure 7:
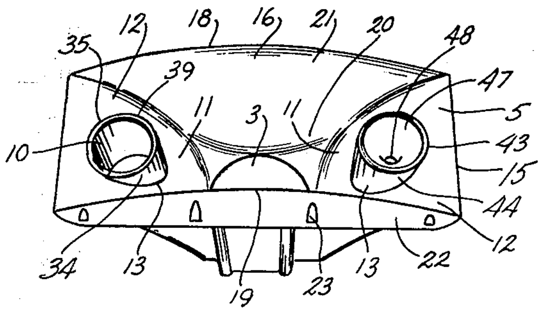
FIG. 7 is a perspective view of the horn taken from a forwardly elevation.

The horn 2 renders the loudspeaker very efficient, and the integral horn-tweeter-duct design provides a sleek, streamlined appearance which is aesthetically pleasing. As best shown in FIGS. 5–7, the illustrated horn 2 is in the nature of a true or pure radial horn, wherein side walls 4 and 5 are flared continuously outwardly from the open throat 3 to the outer horn edges 14 and 15. The inner portions 12 of side walls 4 and 5 are straight, and inclined outwardly at an angle of approximately 60° from the central axis of the horn 2 and throat 3. The outer portions 13 of horn side walls 4 and 5 are arcuately curved from the points 13 at which the speaker 9 and ducted port 10 intersect the associated side wall. The side walls 4 and 5 have a nearly parabolic front elevational shape.

Figure 3:
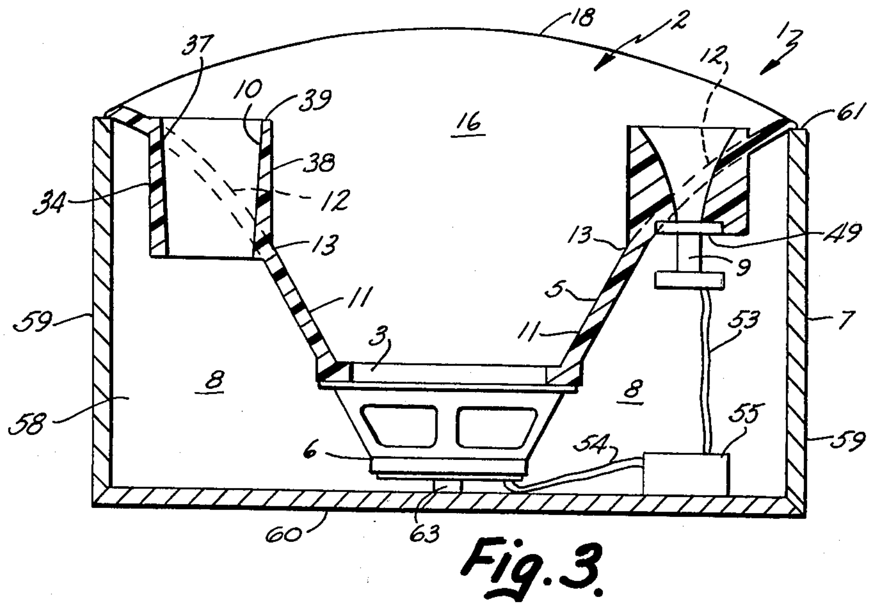
FIG. 3 is a horizontal cross-sectional view of the loudspeaker, taken along the line III—III, FIG. 1.
Figure 4:
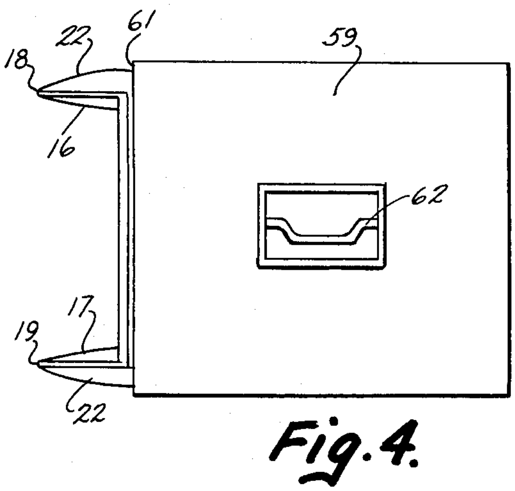
FIG. 4 is a side elevational view of the loudspeaker.

Horn 2 also includes a second pair of curved, outwardly flared side walls 16 and 17 which extend from the open throat 3 to outer horn edges 18 and 19 respectively. The inwardly portions 20 of side walls 16 and 17 are straight, and inclined very slightly outwardly, and the outer portions 21 are curved very gently along a wide radius to the outer edges 18 and 19. A rounded flange 22, curved in an opposite direction from the outer side wall portion 21 intersects the same at the edges 18 and 19. Fastener apertures 23 are positioned in flange 22, and oriented concentric with the open throat 3 to receive fasteners for attaching horn 2 to enclosure 7. As best illustrated in FIG. 3, the free edges 18 and 19 of side walls 16 and 17 are arcuately shaped from a top plan view thereof, and extend outwardly from the forward surface of enclosure 7. Flange 22 (FIG. 5) extends along the free edges 14 and 15 of side walls 4 and 5 to form a closed face for the enclosure. The flange 22 along the free edges 14 and 15 are smooth and arcuate, without any fastener apertures. In the normally preferred orientation, horn walls 4 and 5 are disposed substantially vertically, and walls 16 and 17 are positioned substantially horizontally. However, it is to be understood that the loudspeaker may assume different orientations in accordance with the specific application.

As best illustrated in FIGS. 5 and 6, the interior side of horn 2 includes a flat mounting surface 27 which is adapted to sealingly abut with speaker 6, and attach the same thereto. The upper and lower sides of the horn interior include centrally disposed protrusions 28 with arcuately shaped rails or supports 29 on either side thereof, which are disposed in a mutually parallel orientation. The rails 29 are adapted to reinforce the horn structure and facilitate the mounting of speaker 6.

The ducted port 10 (FIGS. 5–7) includes a generally cylindrically shaped sleeve 34 mounted in the left hand side wall 4, with the exterior end 34 protruding from the outer surface of side wall 4, and the interior end 36 projecting into the rear chamber 8. As best illustrated in FIG. 3, the interior surface 37 of sleeve 34 is tapered slightly outwardly from the interior to the exterior end thereof, and the exterior surface 38 is cylindrical. An annularly shaped ring or rim 39 (FIGS. 6 and 7) is formed at the forward end of sleeve 34, with its outermost portion disposed adjacent to side wall edge 14.

A tweeter horn 43 (FIGS. 5–7), is formed in the opposite horn side wall 5, and includes a cylindrically shaped body 44 with an exterior end 45 protruding beyond the outside surface of side wall 5, and an interior end 46 protruding into the rear chamber 8. The inside surface 47 of tweeter horn 43 tapers inwardly to a relatively small neck or aperture 48. As best illustrated in FIG. 3, although the interior walls are gently curved, they are basically conical in configuration. An annularly shaped ring or rim 50 is formed at the exterior end of tweeter horn 43, which is substantially identical in shape to duct rim 39. An annularly shaped recess 49 (FIG. 5) is provided in the interior end 46 of tweeter body 44, and is adapted to receive and retain therein compression driven tweeter 9. The horn 2, duct 34 and tweeter horn 43 are preferably integral and one piece, being molded from a suitable material, such as urethane. The axis of the horn throat 3, duct 34 and tweeter horn 43 are coplanar to facilitate aiming the speaker.

The shape, size and positioning of the various parts of the loudspeaker affect its operation. One example of the present invention which has proven satisfactory is proportioned in accordance with the illustrated horn 2, and includes an open face approximately 24 inches long and $10\frac{3}{4}$ inches wide, with a depth of $8\frac{3}{4}$ (excluding flange 22), and an open throat of 7 inches. The exterior of the duct 34 and tweeter horn 43 are preferably sized in the range of 3–5 inches in diameter (4 inch diameter shown), and have a center-to-center distance from throat 3 of 7–9 inches ($8\frac{1}{4}$ inches shown). The horn side wall 12 is curved on a radius of $11\frac{1}{4}$ inches, and the tweeter horn surface 47 is curved on a radius of 8 inches. The illustrated duct 34 has a length of 4.88 inches, of which 4.59 inches extends into chamber 8 from the open end 61 of the enclosure 7, thereby tuning the loudspeaker for optimum efficiency and audio response. It is to be understood that the above example is not to be considered limiting, but merely illustrative of one embodiment of the present invention, wherein the position of duct 34 and tweeter horn 43 minimizes the formation of standing waves and reflections in the horn 2. The cylindrical shape of these projections also assists in eliminating any serious detrimental audio disruption.

Figure 2:
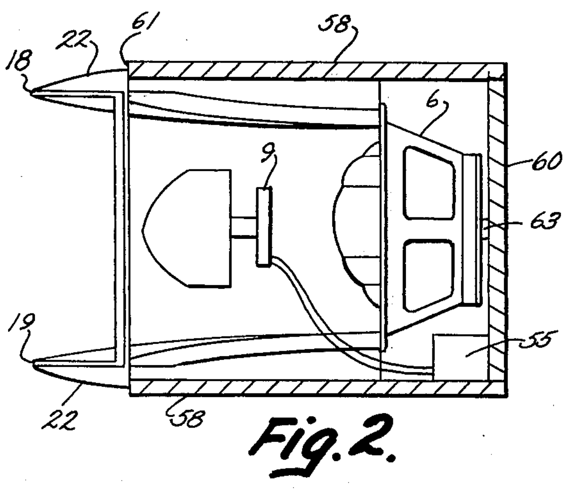
FIG. 2 is a vertical cross-sectional view of the loudspeaker, taken along the line II—II, FIG. 1.

Speaker 6 (FIGS. 2 and 3) is a conventional cone or diaphragm driven speaker, which has a relatively large diameter. Speakers of this type produce substantial "back waves," which are audio waves emanating from the rear surface of the speaker diaphragm. These back waves must be either baffled or phase inverted to achieve proper speaker operation. The illustrated speaker 6 is a conventional cone driven, 10 inch midrange, which is particularly adapted for reproducing audio waves in the range of 100–1000 htz. Speaker 6 is fastened to the mounting surface 27 of the horn and is supported thereby.

The compression driver 9 (FIGS. 2 and 3) is mounted in the recess 49 of tweeter horn 43 to produce a high frequency horn tweeter. Unlike cone driven speaker 6, tweeter 9 has a dome-shaped diaphragm, and produces relatively no back wave. The speaker 6 and tweeter 9 are electrically connected with a conventional crossover network or circuit, which is schematically illustrated in the drawings, and noted by the reference numeral 55.

The cabinet or enclosure 7 (FIGS. 1–4) is substantially rectangular in shape, and includes side and end walls 58 and 59 respectively, and a back panel 60. The open end 61 of the enclosure is shaped to mount the horn 2 with connected speaker 6 therein. The enclosure extends closely about the periphery of the horn, so as to form a very compact, low profile loudspeaker assembly. A handle 62 is provided in one end wall 59 of the closure to facilitate transporting the loudspeaker from one location to another. A support 63 attaches the back of the frame of speaker 6 to securely mount the speaker in the enclosure.

In use, loudspeaker 1 is oriented or aimed in the direction in which the sound is desired to be dispersed or propagated. Usually, the longitudinal or major axis of horn 2 is disposed along a substantially horizontal plane. In this orientation, tweeter 9 is preferably located on the right-hand side of horn 2, as viewed from an observer looking at the front of the loudspeaker. An electrical signal is communicated with the crossover circuit 55, which in turn passes or blocks specific ranges of frequency to the mid-range speaker 6 and tweeter 9. Vibration of the cone portion of speaker 6 sets up or produces back waves emanating from the rear side of the speaker cone into chamber 8. These audio waves are vented out to the exterior portion of the loudspeaker through the tuned duct 34. The propagation of these audio waves through chamber 8 and duct 34 causes a phase shift which produces a low frequency audio sound, in the range of 80–120 htz., which acts like a woofer and compliments the front waves emanating from the forward surface of the cone mid-range speaker 6. The tweeter 9 produces high frequency audio sounds, and directs the same through the tweeter horn 43 and outwardly from the front of the speaker horn 2. Since the compression driver 9 produces relatively no back waves, only low frequency back waves are transmitted through the duct 34.

As described above and best illustrated in FIG. 1, loudspeaker 1 includes three separate, laterally spaced apart sources of sound, which are positioned in a compact arrangement. The mid-range speaker 6 is disposed in the middle of horn 2 and produces mid-range frequency sound waves, with horn 2 dispersing the same in a specification pattern. In the left hand side of horn 2, duct 34 propagates the back waves of the speaker 6, which are slightly lower in tone than the front waves of speaker 6, in the range of a woofer, and directs the same toward the listener. On the right hand side of mid-range speaker 6, tweeter 9 generates high frequency sound waves, and disperses the same through tweeter horn 43 in a specific pattern which is matched with the dispersion pattern of horn 2. These three separate audio signals and patterns combine to form a full range loudspeaker for all types of sound reinforcement. The loudspeaker has a good transient response, a desirable dispersion pattern, and improved acoustic characteristics, all of which are achieved with a very compact physical size. Horn 2 increases the efficiency of cone speaker 6, and controls the audio dispersion pattern of the loudspeaker assembly.

In the foregoing description, it will be readily appreciated by those skilled in the art that many modifications may be made to the invention without departing from the concepts disclosed herein. Such modifications are to be considered as included in the following claims, unless these claims by their language expressly state otherwise.

The embodiments of the invention in which an exclusive property or privilege is claimed are defined as follows:

1. A full range loudspeaker, comprising:

a radial horn having an open throat and a pair of outwardly curved side walls extending therefrom in a generally symmetrical relationship with a central axis of said horn to a mouth portion of said horn;

a cone driven speaker mounted in the open throat of said horn and producing an audio response to an input signal;

a base reflex enclosure having an open side in which said horn with attached speaker is mounted, and forming a single, open chamber between said horn and said enclosure;

a compression driven speaker mounted in one of said curved horn side walls adjacent the mouth portion of said horn, and producing a separate audio response to another input signal; said compression driven speaker having a central axis oriented substantially parallel with the central axis of said horn; and a port disposed in the other of said curved horn side walls adjacent the mouth portion of said horn, and communicating with said chamber to vent back waves therein; said port being defined by a generally cylindrical sleeve having a central axis, and an exterior end protruding from said other horn side wall; the central axis of said port sleeve being oriented substantially parallel with the central axis of said horn, whereby said cone driven speaker, said compression driven speaker, and said port produce three separate, laterally spaced apart sound sources which propagate associated audio signals forwardly along generally parallel axes.

2. A loudspeaker as set forth in claim 1, wherein: said compression driven speaker comprises a tweeter having a tweeter horn extending from the exterior surface of said one horn side wall, and a driver therefor disposed in said chamber.

3. A loudspeaker as set forth in claim 2, wherein: said tweeter horn has a generally conically shaped opening.

4. A loudspeaker as set forth in claim 3, wherein: said tweeter horn has a cylindrically shaped exterior surface.

5. A loudspeaker as set forth in claim 4, wherein: said port sleeve has a cylindrical exterior shape substantially identical to said tweeter horn exterior.

6. A loudspeaker as set forth in claim 5, wherein: said tweeter horn and said port sleeve are positioned symmetrically on said horn side walls.

7. A loudspeaker as set forth in claim 6, wherein: said radial horn, said port sleeve, and said tweeter horn are integrally molded.

8. A loudspeaker as set forth in claim 7, wherein: said radial horn includes a second pair of outwardly curved side walls generally disposed along a substantially horizontal plane.

9. A loudspeaker as set forth in claim 8, wherein: said port sleeve includes an interior end which protrudes into said chamber a distance selected to tune said loudspeaker for optimum efficiency and audio response.

10. A loudspeaker as set forth in claim 1, wherein: said compression driven speaker has a generally conically shaped opening.

11. A loudspeaker as set forth in claim 1, wherein: said compression driven speaker has a cylindrically shaped exterior surface.

12. A loudspeaker as set forth in claim 7, wherein: said port sleeve has a cylindrical exterior shape substantially identical to the exterior surface of said compression driven speaker.

13. A loudspeaker as set forth in claim 1, wherein: said radial horn, said port sleeve, and a horn portion of said compression driven speaker are integrally molded.

14. A loudspeaker as set forth in claim 1, wherein: said radial horn includes a second pair of outwardly curved side walls generally disposed along a substantially horizontal plane.

15. A loudspeaker as set forth in claim 1, wherein: said port sleeve includes an interior end which protrudes into said chamber a distance selected to tune said loudspeaker for optimum efficiency and audio response.

16. A loudspeaker, comprising:

a horn having an open throat and outwardly flared side walls extending therefrom in a generally symmetrical relationship with a central axis of said horn to a mouth portion of said horn;

a cone driven mid-range speaker mounted in the open throat of said horn and producing a generally mid-frequency audio response to an input signal;

a base reflex enclosure having an open side in which said horn and said speaker are mounted, and forming a single, open chamber between the interior side of said horn and said speaker and the interior side of said enclosure;

a compression driven high-range speaker mounted on one of said curved horn side walls adjacent the mouth portion of said horn, and producing a generally high frequency audio response to an input signal; said compression driven speaker having a central axis oriented substantially parallel with the central axis of said horn; and a port disposed in another curved side wall of said horn adjacent said mouth portion thereof, communicating with said chamber to vent back waves therein, and emitting a substantially low range audio sound therefrom; said port being defined by a generally cylindrical sleeve having a central axis, and an exterior end protruding from said other horn side wall; the central axis of said port sleeve being oriented substantially parallel with the central axis of said horn, whereby said cone driven speaker, said compression speaker, and said port produce three separate, laterally spaced apart sound sources which forwardly propagate audio signals in the low, mid, and high frequency ranges for full-range sound reinforcement.

* * * * *